United States Patent [19]

Payen et al.

[11] Patent Number: 4,991,186
[45] Date of Patent: Feb. 5, 1991

[54] HIGH FREQUENCY CLOCK-PULSE COUNTER

[75] Inventors: Hubert Payen; Bernard Pain, both of Valence, France

[73] Assignee: Sextant Avionique, Meudon la Foret Cedex, France

[21] Appl. No.: 440,527

[22] Filed: Nov. 22, 1989

[30] Foreign Application Priority Data

Nov. 23, 1988 [FR] France ............................ 88 15998

[51] Int. Cl.$^5$ ................. H03K 21/02; H03K 21/10; H03K 21/40
[52] U.S. Cl. ......................................... 377/44; 377/37; 377/55; 377/56; 377/28
[58] Field of Search ................. 377/44, 37, 55, 56, 377/28

[56] References Cited

U.S. PATENT DOCUMENTS

| | | | |
|---|---|---|---|
| 3,982,108 | 3/1975 | Horsley | 377/56 |
| 4,160,154 | 7/1979 | Jennings | 377/44 |
| 4,499,589 | 2/1985 | Geesen | 377/44 |
| 4,519,091 | 5/1985 | Chu et al. | 377/44 |

OTHER PUBLICATIONS

NASA Tech Briefs, "Simple Logic Reads Out During Counting", *Electronic Design* 11, May 24, 1967, p. 107.

*Primary Examiner*—John S. Heyman
*Attorney, Agent, or Firm*—Lowe, Price, LeBlanc, Becker & Shur

[57] ABSTRACT

A counter comprising n one-bit cells receiving a clock signal (CK0) having a frequency f to be counted and a read transfer order (TO). The lower rank p cells operate at the frequency f and the n-p higher rank cells at a frequency $f/2^p$. The lower rank p cells (51-53) directly receive the clock signal (CK0) at frequency f and, if necessary, the transfer order (TO) synchronized in correspondence with CK0. The higher rank n-p cells receive as a clock signal at frequency $f/2^p$, a signal (CK1) delayed by at least two periods of said clock signal CK0 and at the most by (2p−2) pulses CK0 with respect to the counting signal of the highest rank cell among the lower rank p cells.

6 Claims, 4 Drawing Sheets

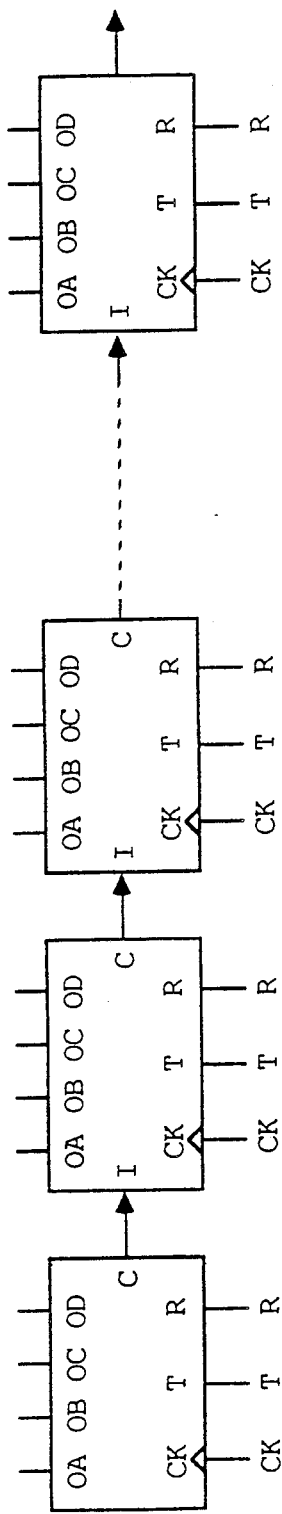
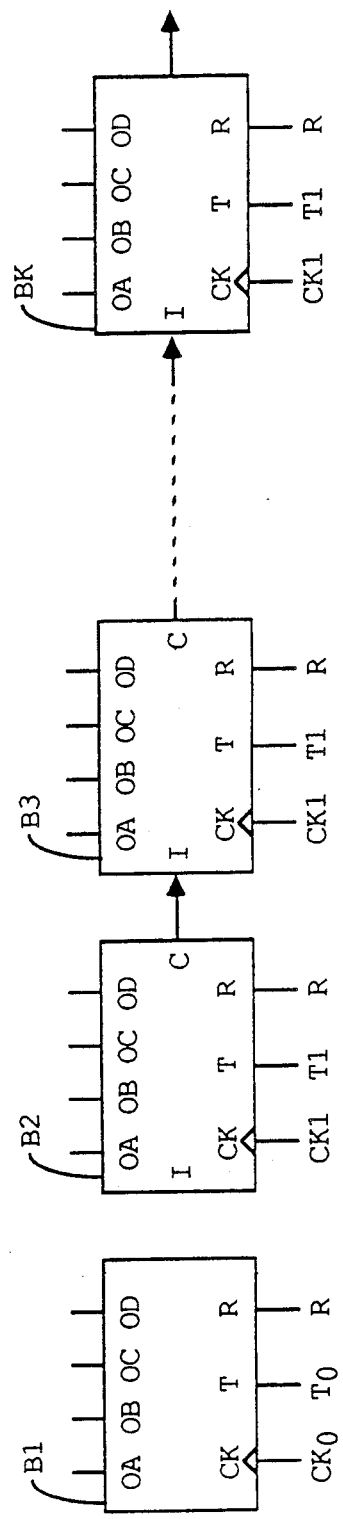
Figure 1
Figure 2

HIGH FREQUENCY CLOCK PULSE COUNTER

BACKGROUND OF THE INVENTION

The invention relates to a clock pulse counter and more particularly to such a counter designed to operate at a very high frequency.

This counter can for example be constituted by an integrated circuit comprising prediffused or master cells.

Conventionally, in order to realize a clock pulse counter, a large number of bit counting cells are associated and are in turn grouped into blocks.

FIG. 1 very schematically shows such an assembly wherein each block comprises four counting outputs OA, OB, OC and OD. All the blocks comprises a clock input OK receiving the same pulses to be counted, OK, a reset input R receiving the same reset signal, R, and a transfer input T receiving a same transfer order, T. Each block transmits to the input I of the following block a carry signal through a terminal C when all its bits are set to "1". Each block comprises counting flip-flops and latches wherein the content of all the counting flip-flops is transferred at the time a transfer order T is applied to the inputs T. This order T is synchronized again with the clock signal OK in order to memorize a stable information of the state of the counting outputs OA, OB, OC, OD.

A drawback of this conventional architecture lies in the fact that, when it is desired to count the clock pulses recurring at a very fast rate, all the blocks, that are identical, have to be carried out at the best of the manufacturing technology. As a result, all the flip-flops are realized according to critical design rules and the consumption of the circuit is liable to be very important. Consequently, the manufacturing performance of such counters, constituted for example by arrays of prediffused gates, is low.

SUMMARY OF THE INVENTION

An object of the invention is to remedy this drawback by limiting the number of cells, the manufacturing of which is critical.

In order to achieve this object, the invention provides to divide the counter into one counting block for the high precision low rank bits and several counting blocks for the high rank bits operating at a slower frequency, the manufacturing of which being then less critical.

More particularly, the invention provides for an application of the clock signals and transfer signal to the higher rank cells from clock and transfer signals applied to the lower rank cells permitting to avoid any ambiguity at the time the counter is read (application of the transfer order).

Thus, the invention provides for a counter comprising n one-bit cells receiving a clock signal with a frequency f to be counted and a transfer order at the time it is desired to read the counter, wherein the p cells of the lower rank are adapted to operate at the frequency f and the n-p cells of the higher rank at the frequency $f/2^p$. The p cells of the lower rank directly receive the clock signal at the frequency f and, if necessary, a transfer order synchronized with the clock signal. The n-p higher rank cells receive, as a clock signal at the frequency $f/2^p$, a signal delayed by at least two clock pulses and at the most p clock pulses with respect to the output signal of the cell having the higher rank among the p cells of the lower rank and, as a transfer signal, a pulse delayed with respect to said transfer order so as to appear during the following clock pulse or during the occurring clock pulse which corresponds to a setting to "1" of all the cells of the first p cells.

Owing to this arrangement, the Applicant has been able to realize a 24-bit counter, wherein only three cells of which corresponding to the three lower rank bits operate at the maximum clock frequency, for example about 30 MHz, the other cells operating at a rate eight times slower and being therefore not critical.

BRIEF DISCLOSURE OF THE DRAWINGS

The foregoing and other objects, features and advantages of the invention will be apparent from the following detailed description of a preferred embodiment as illustrated in the accompanying drawings wherein:

FIG. 1 is a block diagram of the design of a digital counter according to the prior art;

FIG. 2 is a block diagram of the design of a counter according to the invention;

DETAILED DESCRIPTION OF THE INVENTION

Figure 3:
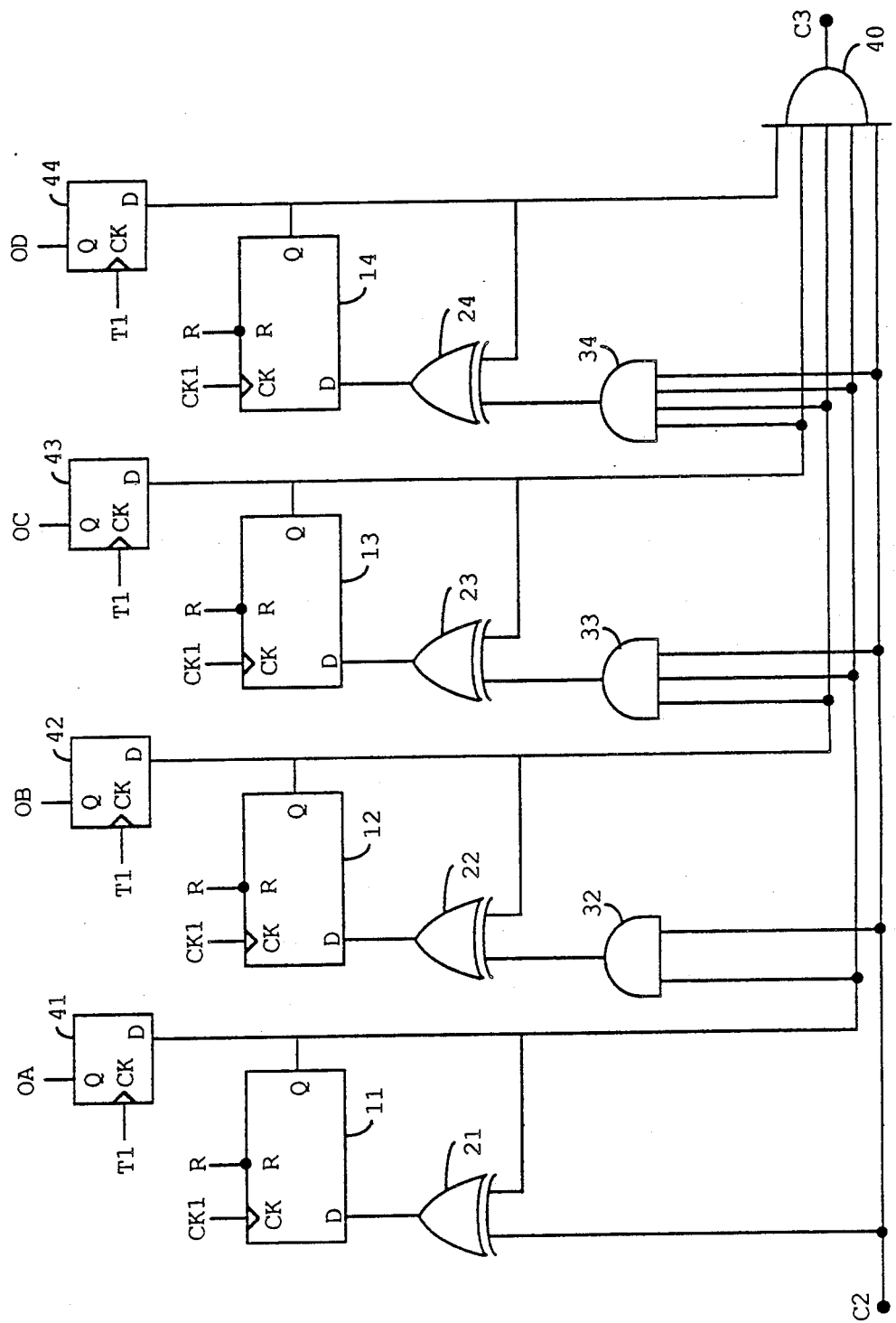
FIG. 3 is an exemplary diagram of a counting block usable for the upper rank cells of a counter according to the invention.

As shown in FIG. 2, a specific feature of the n-bits counter according to the invention is that the counting block B1 of the lower rank p bits is separated from the counting blocks B2, B3 ... Bk of the upper rank n-p bits. While the counting block B1 receives the clock signals CK0 at the frequency that it is desired to count on its input OK, the blocks B2, B3 ... Bk receive clock signals CK1 at a frequency divided by $2^p$ with respect to the clock frequency CK0, p being the number of the counting cells of block B1. Thus, there is no carry transmission between block B1 and block B2 but only between block B2 and the following blocks.

The advantages of such an architecture lie in the fact that blocks B2, B3 ... Bk, which operate at a frequency slower than block B1, are liable to be designed less accurately on an integrated circuit and therefore the overall performance will be simplified since only block, B1, has to be realized at the best of the technology used. Moreover, owing to the lower frequency applied to blocks B2, B3 ... Bk, the consumption of those blocks, and therefore the overall consumption of the counter assembly, is reduced.

However, this circuit presents some difficulties as regards the reading of the counter at the time the transfer order is supplied. Indeed, in a counter comprising a large number of blocks, the carry transmission times from one block to another are far from being negligible with respect to the clock frequency and, for example on a 24-bits counter and for a high counting frequency, the transmission times are liable to correspond to 2 or 3 clock pulses.

Thus, as it has been hereinabove explained, the invention provides for:

on the one hand, delaying the clock signal OK1 applied to the upper rank blocks with respect to the output signal of the last cell of the lower rank block, on the other hand, once the general transfer order has been received, applying a transfer pulse (or read order) to the higher order blocks only close to the time when all the lower rank cells are set to 1. At that time, the signal OK1 applied to the higher rank blocks is inactive, which avoids any evolution of blocks B2 to Bk.

Those characteristics of the invention will be described in more detail hereinafter in connection with a preferred embodiment thereof.

FIG..3 shows a counting block comprising four cells corresponding to an intermediate block among blocks B2, B3 . . . Bk illustrated in FIG. 2, for example block B3. This counting block comprises D-type filp-flops 11, 12, 13, 14 each of which comprises a clock input OK, a reset input R, a flip-flop input D and an output Q. The input D of each flip-flop 11, 12, 13, 14 receives the output of an Exclusive OR gate, respectively 21, 22, 23, 24. The first input of each of the Exclusive OR gates 21, 22, 23, 24 receives the output Q of the corresponding flip-flop 11, 12, 13, 14. The second input of each of those Exclusive OR gates receives the carry signal C2 from the preceding block, directly as regards the first cell (21) of the block, and through the AND gates 32, 33, 34 as regards the following cells. The AND gates 32, 33, 34 combine the signal C2 with the output of the preceding cell(s) of the same block. All the outputs Q of flip-flops 11, 12, 13, 14 as well as the carry signal C2 of the preceding block are combined in an AND gate 40 for supplying the carry signal C3 to the considered block.

Lastly, the outputs Q of the counting flip-flops 11, 12, 13, 14 are respectively supplied to the inputs D of latches 41, 42, 43, 44 which are charged at the time a transfer signal T1 is supplied to their input OK for indicating on their output Q the state of the corresponding counting flip-flop. Those latches 41, 42, 43, 44 are represented as D-type flip-flops but they are liable to be other types of latches.

The operation of such a circuit will not be detailed since it is known by those skilled in the art. It will only be reminded that the output carry signal C3 is supplied only when all the flip-flops of the block are set to "1", immediately before or after those flip-flops have been reset.

The block diagram of FIG. 3 is only an exemplary embodiment of a counting block. Numerous variants have been devised in the technique in order to optimize the realization and possibly accelerate the operation. Indeed, the transmission time through a gate is not negligible and it is necessary to realize an optimal association for minimizing the transmission time of the assembly. For example, the cells will not necessarily comprise four blocks, and the various gates are liable to be realized according to subassemblies if this seems to be desirable. On the other hand, it will be reminded that the block illustrated in FIG. 3 is an intermediate counter block. If it were a first block, it would not receive any carry signal from a preceding block and the first cell of the block (the cell having the smallest rank) would have for example its input D coupled to its output Q by a simple inverter.

Figure 4:
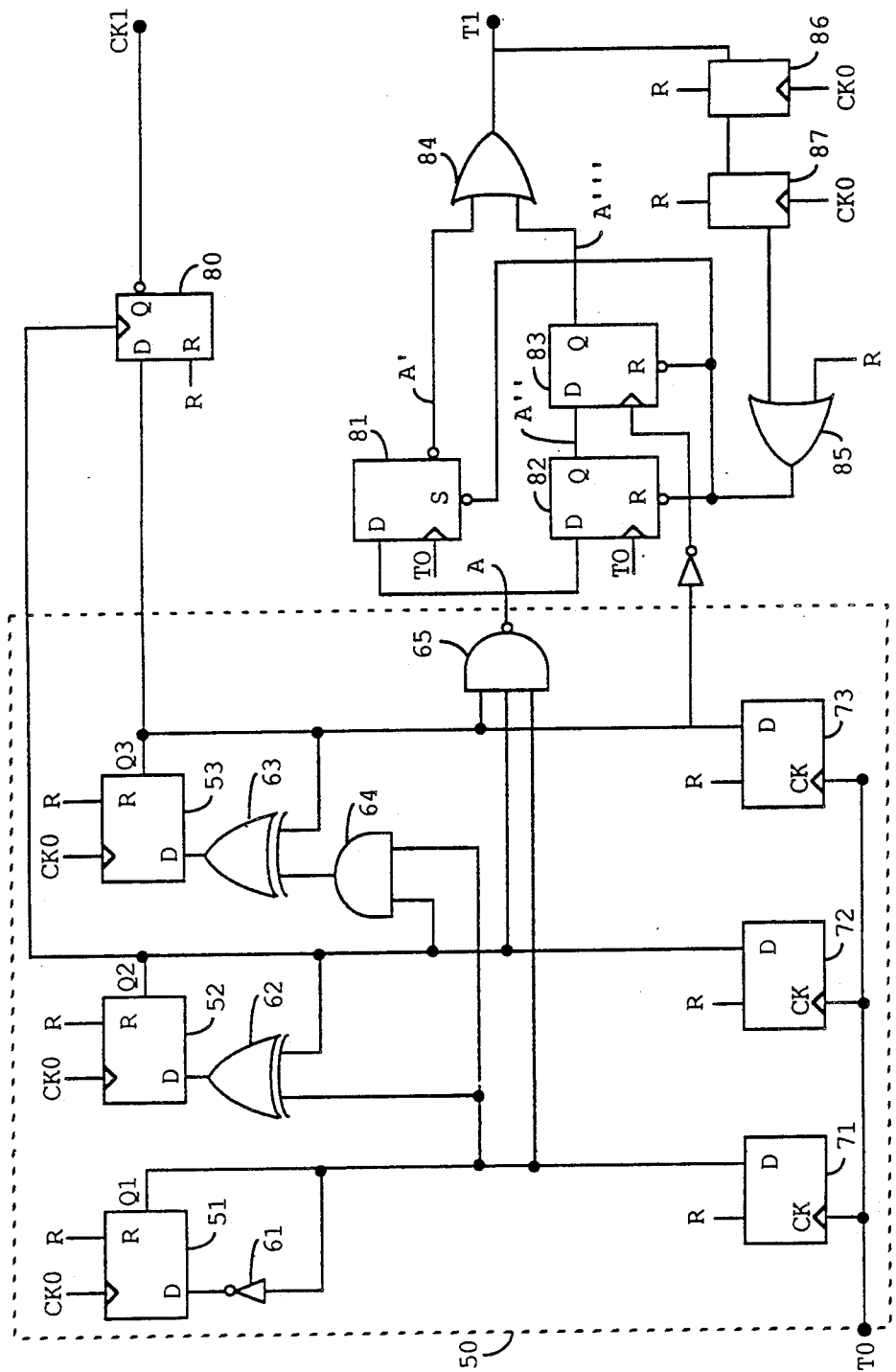
FIG. 4 shows a circuit comprising the lower rank cells of a counter according to the invention and means for supplying the clock and transfer signals for the higher order counting blocks.

FIG. 4 shows the implementation of a first counting block, corresponding to the least significant bits of a counter according to the invention and a circuit designed to supply the clock and transfer signals for the highest rank stages of the counter (such as that of FIG. 3).

In FIG. 4, the counting and memorization block. is shown inside the rectangle, referenced 50, drawn in dotted lines. It receives the clock inputs OK0 to be counted, a reset input R and a transfer input TO.

In the example shown, block 50 comprises three counting flip-flops 51, 52, 53 analogous to those of the cells shown in FIG. 3, except that flip-flop 51 corresponding to the least significant weight bit has its input D directly connected to its output through an inverter 61 while the inputs D of flip-flops 52 and 53 are connected to the output of the Exclusive OR gates 62 and 63. The first input of the Exclusive OR gate 62 receives the output Q2 of flip-flop 52 and its second input the output Q1 of flip-flop 51. The first input of the Exclusive OR gate 63 receives the output Q3 of this flip-flop and its second input receives the output of an AND gate 64, the first and second inputs of which respectively receive signals Q1 and Q2. The three outputs Q1, Q2, Q3 are connected to three inputs of an AND gate 65 having a complementary output (AND-NOT gate). Moreover, the outputs Q1, Q2, Q3 are connected to the inputs D of latches 71, 72 and 73, respectively, for transferring thereto the content of flip-flops 51, 52, 53 at the time a transfer pulse TO is supplied on their clock input OK. This transfer pulse is synchronized with the clock signal to be counted.

Figure 5:
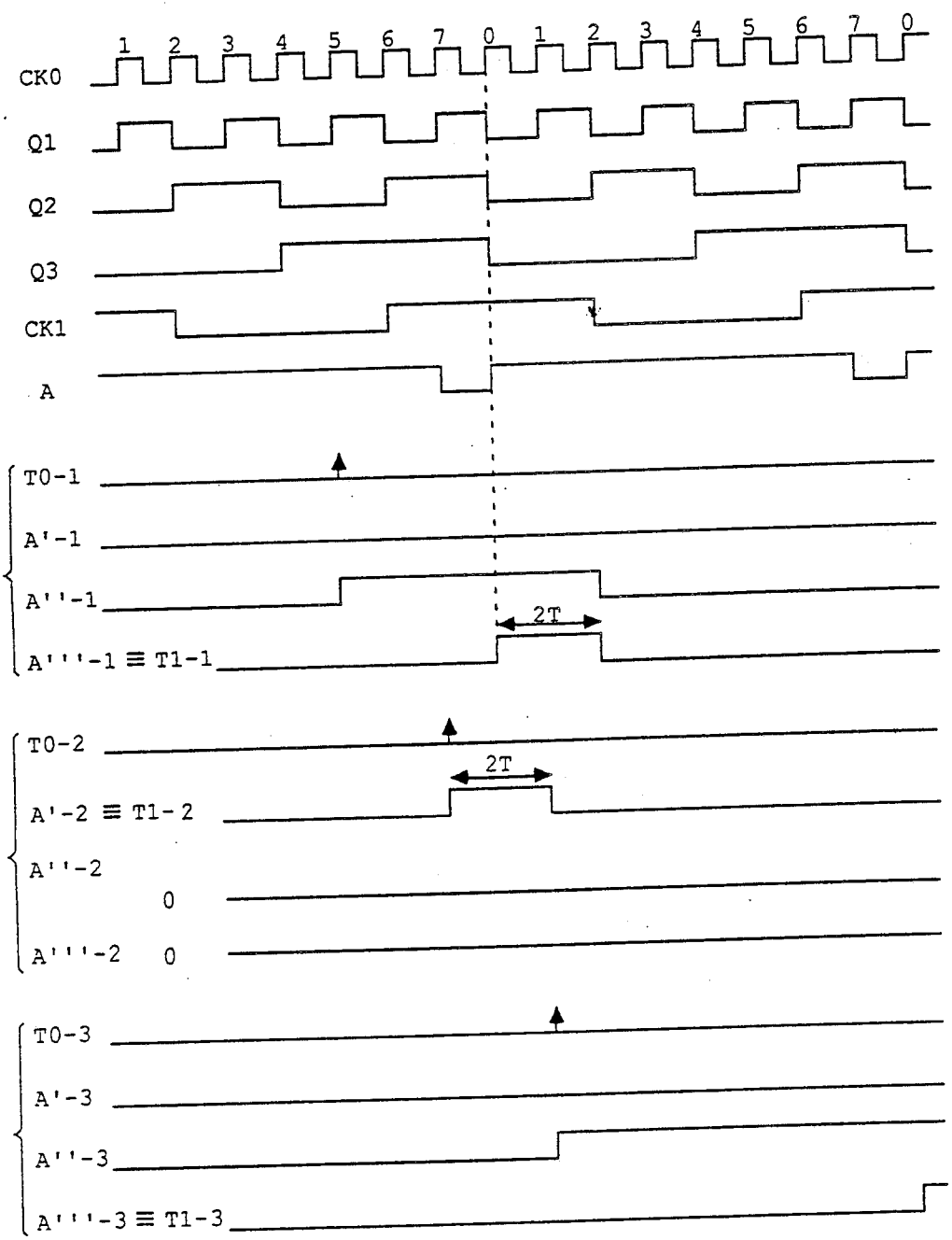
FIG. 5 shows timing diagrams of signals explaining the operation of the counter according to the invention.

FIG. 5 shows the shape of the signals:
CK0 is the input clock,
Q1 is the output signal of flip-flop 51,
Q2 is the output signal of flip-flop 52,
Q3 is the output signal of flip-flop 53,
A is the output signal of AND gate 65.

It will be noted that, since a complementary output of AND gate 65 is used, signal A is set to "0" when all the inputs of the AND gate, that is, the content of the three flip-flops 51, 52, 53, are set to "1".

Moreover, the invention provides, as this has been hereinabove mentioned, for controlling at a lower rate the higher rank counting blocks. For this purpose, the invention provides not only to send to those blocks a clock signal CK1, the frequency of which corresponds to the output signal Q3 of flip-flop 53, but besides to delay this signal CK1 for avoiding any ambiguity in case a transfer occurs at the neighbourhood of the filling of the first counting block of the lower rank.

This clock signal CK1 delayed with respect to the clock signal CK0 and at a frequency lowered by 8 ($2^3$) is liable to be supplied, as shown, by a D-type flip-flop 80, the input D of which receives the output Q3 of flip-flop 53 and the clock input of which receives the output Q2 of flip-flop 52 for supplying on its complementary output Q* the desired signal CK1 illustrated in FIG. 5. Thus, signal CK1 corresponds to signal Q3 delayed by 3×2 clock pulses CK0 (or more generally by $3 \times 2^{p-2}$).

On the other hand, at the output of AND gate 65, is arranged the circuit for supplying the transfer signal T1 to the upper rank blocks. This circuit comprises a first D-type flip-flop 81 and a second D-type flip-flop 82, both receiving on their input D the output of AND gate 65 and on their clock input the transfer pulse T0 of the system. Output Q of the second flip-flop 82 is supplied to the input D of a third flip-flop 83, the clock input of which receives the complementary signal Q3. The complementary signal Q* of flip-flop 81 and the direct output of flip-flop 83 are connected to two inputs of an OR gate 84, the output of which supplies the desired signal T1. Moreover, a system is provided for resetting flip-flops 81, 82, 83. By way of example, this reset circuit receives the pulse T1 and supplies it to an OR gate 85 after a delay of two clock periods CK0 by means of two flip-flops 86 and 87 receiving this signal CK0 on their clock input. The output of OR gate 85 is sent to the reset inputs (R) of flip-flops 82 and 83 and to a set input (S) of flip-flop 81. The second input of OR gate 85 receives the reset signal R of the whole counter.

For explaining the operation of the transfer signal circuit T1, A' designates the output of flip-flop 81, A" the output of flip-flop 82 and A''', the output of flip-flop 83.

The timing diagrams T0-1, A'-1, A"-1 and A'''-1 show the state of the circuit supplying the transfer pulse T1 in case the transfer signal T0, in that case T0-1, arrives before the output signal A of the AND gate 65 has been switched to low level, that is, before the counting block comprising flip-slops 51, 52, 53 has arrived to its maximum counting state. Before the arrival of signal T0-1, because of the above mentioned reset signals, signals A', A" and A''' are set to "0". At the arrival time of pulse T0-1, the direct outputs of flip-flops 81 and 82 are set to "1", that is, signal A'-1 which corresponds to the complementary output remains to "0" while signal A"-1 is set to "1". Then, signal A'''-1 is set to "1" as soon as the next transition of signal Q2 from "0" to "1" is carried out (this flip-flop receives the complementary signal Q2). Then, signal A'''-1 remains set to "1" for two periods of the clock signal CK0 (2T) and is then again reset by the reset circuit 85, 86, 87.

At the output of OR gate 84, signal T1-1 will then correspond to this signal A'''-1. Preferably, the latches associated with the higher rank counting flip-flops will be such that they memorize the information of the counting flip-flops only at the end of interval 2T illustrated, that is, at the end of pulse T1. Thus, the delay between the measurement phase and the last operation of those counting flip-flops will correspond to four periods of clock signal CK0 (two periods T due to the fact that signal CK1 is delayed by six periods with respect to signal Q3 plus two periods associated with the pulse duration time T1).

The case where the clock pulse arrives at the time when the three lower rank flip-flops 51, 52, 53 are set to their maximum counting state is illustrated by pulse T0-2. In this case, it is necessary to read the blocks of the higher rank flip-flops before the first counting pulse CK1 is supplied thereto.

In this case, as shown by curves A"-2 and A'''-2, flip-flops 82 and 83 remain to "0" and output A'-2 of flip-flop 81 is set to "1" upon the arrival of pulse T0 and it is the signal A'-2, reset after two clock periods T, that is transmitted to the output of OR gate 84.

Thus, due to the fact that a delay of six clock periods has been provided for applying the signal CK1 of the higher rank blocks, it is ascertained that the data reading concerning those higher rank blocks does not take into account the overflow of the lower rank block (51, 52, 53). Moreover, the higher rank blocks will have had sufficient time to get stabilized (three or four clock periods T, as above mentioned).

Lastly, if the transfer order arrives immediately after the lower counting block has been set to "1", as illustrated by pulse T0-3, the same case as that of order T0-1 is encountered and the data reading of the higher rank blocks will be carried out at the next high/low transition of the transfer signal T1-3, which allows for a stabilization time of at least four clock periods for those blocks.

Of course, the invention is liable of numerous variants. In particular, it is possible to select other implementations of the counting blocks, both for the lower rank block and the higher rank blocks, than those illustrated hereinabove. On the other hand, the various improvements that are usually brought to counting blocks are liable to be associated with the invention; in particular, for practical implementations, test signal inputs and selected partitions of the various gates and flip-flops can be provided for. Similarly, there are numerous variants for realizing the signals CK1 and T1 that are necessary for the proper operation of the higher rank blocks.

We claim:

1. A counter comprising n one-bit cells receiving a clock signal having a frequency f to be counted and a transfer order at the time it is desired to read the counter, said counter being separated into lower rank p-cells and higher rank n-p cells wherein the p cells of the lower rank are operated at the frequency f and the n-p cells of the higher rank at the frequency $f/2^p$, wherein:

the p cells of the lower rank directly receive said clock signal at the frequency f and, when necessary, said transfer order synchronized with said clock signal, the n-p cells of the higher rank receive:
as a signal at the frequency $f/2^2$, a delayed clock signal, delayed by at least two clock pulses at the frequency f and at the most by $(2^p-2)$ clock pulses at the frequency f with respect to the output signal of the cell having the highest rank among the p cells of the lower rank, and as a transfer signal, a pulse delayed with respect to aid transfer order so as to appear only during the following or present clock period which corresponds to a setting to "1" of all the first p cells.

2. A counter according to claim 1 wherein the delayed clock signal of the n-p cells of the higher rank is delayed by substantially $3 \times 2^{p-2}$ clock pulse.

3. A counter according to claim 2 wherein the delayed clock signal is supplied by a D-type flip-flop, the input D of which receives the output of the $p^{th}$ cell of the first p cells and the clock input of which receives the output of the $(p-1)^{th}$ cell.

4. A counter according to claim 1 wherein the transfer pulse of the (n-p) cells of the higher rank is supplied by a circuit comprising:
an AND-NOT gate, the output of which is connected to the input D of the first and second D-type flip-flops, the clock input of which receives said transfer order,
a third D-type flip-flop receiving the direct output of the second flip-flop and the clock input of which receives the output of the $p^{th}$ cell among the first p ones,
an OR gate, the first input of which receives the complementary output of the first D-type flip-flop and the second input of which receives the direct output of the third D-type flip-flop, the output of this OR gate supplying said transfer pulse for the n-p cells of the higher rank, and
a reset circuit for resetting the second and third flip-flops and for setting the first flip-flop to "1" shortly after said transfer pulse has been supplied.

5. A counter according to claim 1 wherein p=3 and n=24.

6. A counter according to claim 5 wherein the clock frequency f of the first p cells is 30 MHz.

* * * * *